United States Patent [19]

Zuhr et al.

[11] Patent Number: 5,354,583
[45] Date of Patent: Oct. 11, 1994

[54] APPARATUS AND METHOD FOR SELECTIVE AREA DEPOSITION OF THIN FILMS ON ELECTRICALLY BIASED SUBSTRATES

[75] Inventors: Raymond A. Zuhr, Oak Ridge; Tony E. Haynes, Knoxville, both of Tenn.; Andrzej Golanski, Cheylas, France

[73] Assignee: Martin Marietta Energy Systems, Inc., Oak Ridge, Tenn.

[21] Appl. No.: 972,778

[22] Filed: Nov. 9, 1992

[51] Int. Cl.$^5$ ............................................. B05D 3/06
[52] U.S. Cl. .................................. 427/526; 427/527; 427/528; 427/570
[58] Field of Search .............. 427/526, 525, 527, 574, 427/578, 579, 528, 570

[56] References Cited

U.S. PATENT DOCUMENTS

| | | |
|---|---|---|
| 4,155,735 | 5/1979 | Ernsberger . |
| 4,480,010 | 10/1984 | Sasanuma et al. . |
| 4,944,961 | 7/1990 | Lu et al. . |
| 4,976,818 | 12/1990 | Hashimoto et al. . |
| 5,128,173 | 7/1992 | Kugan . |
| 5,206,060 | 4/1993 | Balian et al. ................ 427/578 |

FOREIGN PATENT DOCUMENTS

| | | |
|---|---|---|
| 0018183 | 6/1978 | Japan . |
| 0064778 | 4/1984 | Japan . |
| 0211924 | 10/1985 | Japan . |
| 3033561 | 2/1988 | Japan . |
| 2070647 | 9/1981 | United Kingdom . |

OTHER PUBLICATIONS

Yamada et al., Film Deposition and Buried Layer Formation by Mass-Analyzed Ion Beams, *Nuclear Instruments & Methods in Physics,* 1985, pp. 439–446, no month.

*Primary Examiner*—Marianne Padgett
*Attorney, Agent, or Firm*—Edward A. Pennington; Howard N. Flaxman; George L. Craig

[57] ABSTRACT

An ion beam deposition process for selective area deposition on a polarized substrate uses a potential applied to the substrate which allows the ionized particles to reach into selected areas for film deposition. Areas of the substrate to be left uncoated are held at a potential that repells the ionized particles.

4 Claims, 2 Drawing Sheets

APPARATUS AND METHOD FOR SELECTIVE AREA DEPOSITION OF THIN FILMS ON ELECTRICALLY BIASED SUBSTRATES

This invention was made with Government support under contract DE-AC05-84OR21400 awarded by the U.S. Department of Energy to Martin Marietta Energy Systems, Inc. and the Government has certain rights in this invention.

FIELD OF THE INVENTION

The present invention relates generally to electrostatics and the deposition of thin films and, more specifically, to an apparatus and method for selective area deposition of thin films on electrically polarized substrates. The application of an electric field, while depositing the thin film with an ion deposition technique facilitates selected area deposition.

BACKGROUND OF THE INVENTION

Thin film deposition is a vital aspect of semiconductor manufacture. In order to produce an integrated circuit, thin films of various materials are used as barriers to the diffusion or implantation of impurity atoms, or as insulators between conductive materials and the silicon substrate. Typically, holes or windows are cut through the barrier material wherever impurity penetration or contact is required.

A mask is used to form the necessary pattern or windows or holes on the surface of the silicon substrate. The patterns are first transferred from the mask to a light-sensitive photoresist. Chemical or plasma etching is then used to transfer the pattern from the photoresist to the barrier material on the surface of the silicon substrate. Each mask step requires successful completion of numerous processing steps.

Ion implantation is commonly used in manufacturing semiconductors to introduce impurity atoms into the silicon substrate, and offers certain advantages over high temperature diffusion. Generally, an ion implanter is a high-voltage particle accelerator producing a high-velocity beam of impurity ions which can penetrate the surface of silicon target wafers. The ion source operates at a high voltage of, for example, 25 kV, and produces a plasma containing the desired impurity as well as other undesired species. An accelerator column adds energy to the beam, for example, up to 175 keV, and accelerates the ions to their final velocity.

In semiconductor manufacturing, as well as other processing fields, there is a continuing need for improved selected area deposition techniques. In many applications it is desirable to be able to deposit material on a selective basis so as to build up films in certain complex patterned regions of a substrate, but not in other adjacent regions. An example in the semiconductor art is the filling of via holes and trenches with conducting metallic films during integrated circuit manufacturing.

Ion deposition of thin films has been described in "Film Deposition and Buried Layer Formation By Mass-Analyzed Ion Beams" by I. Yamada et al. in *Nuclear Instruments and Methods in Physics Research* B6, 439-446 (1985 North-Holland, Amsterdam). In this publication, Si was metallized by a mass-analyzed ion beam to form Pb thin films.

Ion deposition has been described in the following U.S. patents:

U.S. Pat. No. 4,480,010 to Sasanuma et al. describes a method and apparatus for coating materials by ion plating. A negative potential relative to that of the vapor source is applied to the substrate in order to facilitate the bombardment effect. At the intermediate stage of the process, the potential of the substrate is left floating while the ionization means is being driven in order to control the bombardment effect.

U.S. Pat. No. 4,155,735 to Ernsberger describes an electromigration method for making stained glass photomasks. Stain-producing ions are migrated into the surface of the glass under the influence of an electric field and moderately elevated temperatures. Positive potential is applied to two electrode layers to cause the migration of mobile cations out of specific zones of the glass underlying a photoresist.

U.S. Pat. No. 4,944,961 to Lu et al. describes the deposition of metals on stepped surfaces using an ionized beam technique. Ionized vapor is drawn to a substrate by an imposed bias.

U.S. Pat. No. 5,128,173 to Kugan describes a process for deposition of inorganic materials using an ionized beam technique. A deposition area is negatively charged to attract positively charged ions from the deposition material.

Japanese patent 53-18183 describes a process for selectively depositing an ionized substance onto a desired area of an electrically conductive substrate in which the rest of the substrate is first covered with an insulating film.

A continuing need exists for improved apparatuses and methods for selective area deposition of thin films onto substrates.

SUMMARY OF THE INVENTION

An object of the present invention is to provide an apparatus and method of selective area deposition controlled completely by applied local electric fields without external operator intervention.

Another object of the present invention is to provide an apparatus and method of selective area deposition which reduces the number of additional masking levels or lift-off steps to define the areas to be deposited.

Another object of the present invention is to provide an apparatus and method of selective area deposition in which the angle of incidence of the arriving ions can be determined by the local geometry and resultant localized electric fields.

Still another object of the present invention is to provide an apparatus and method of selective area deposition in which the energy of the incident ions, from a few eV to hundreds of eV, can be utilized to improve film quality, increase film density, improve interface adhesion, induce chemical reactions, and/or stimulate epitaxial growth.

These and other objects of the invention are met by providing a method of selective area deposition of a thin film on an electrically polarized substrate, the substrate having a pattern formed thereon to define an electrically conductive region and an electrically insulating region, the method including the steps of exposing the patterned substrate to an ion beam having an electric potential, and applying an electric potential to the substrate to give the electrically conductive region an electric potential different from the ion beam.

Other objects, advantages and salient features of the invention will become apparent from the following detailed description, which taken in conjunction with

DETAILED DESCRIPTION OF THE INVENTION

Figure 1:
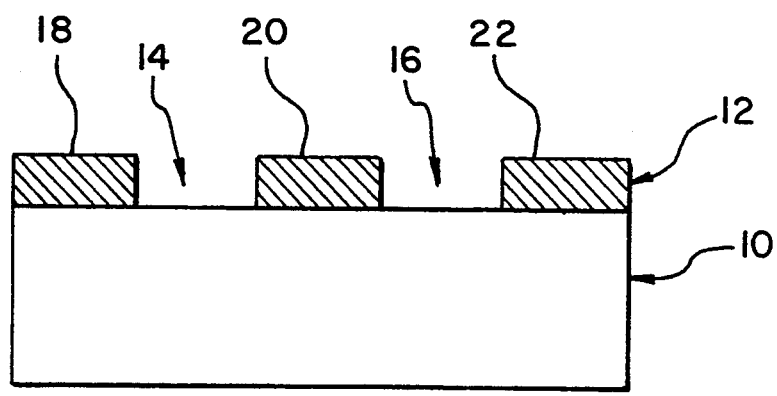
FIG. 1 is schematic, vertical sectional view of a patterned substrate prior to being subjected to the selective deposition technique according to the present invention.

Referring initially to FIG. 1, a silicon (Si) substrate 10 is provided with an insulating layer 12 of silicon dioxide ($SiO_2$). By using standard photolithographic processing techniques the layer 12 is patterned to form troughs 14 and 16 disposed between what appear in cross section as pillars 18, 20, and 22. Because the troughs 14 and 16 expose the upper surface of the Si substrate 10, the substrate is patterned to include an electrically conductive region where the upper surface is exposed and an electrically insulating region where the $SiO_2$ layer is disposed.

Figure 2:
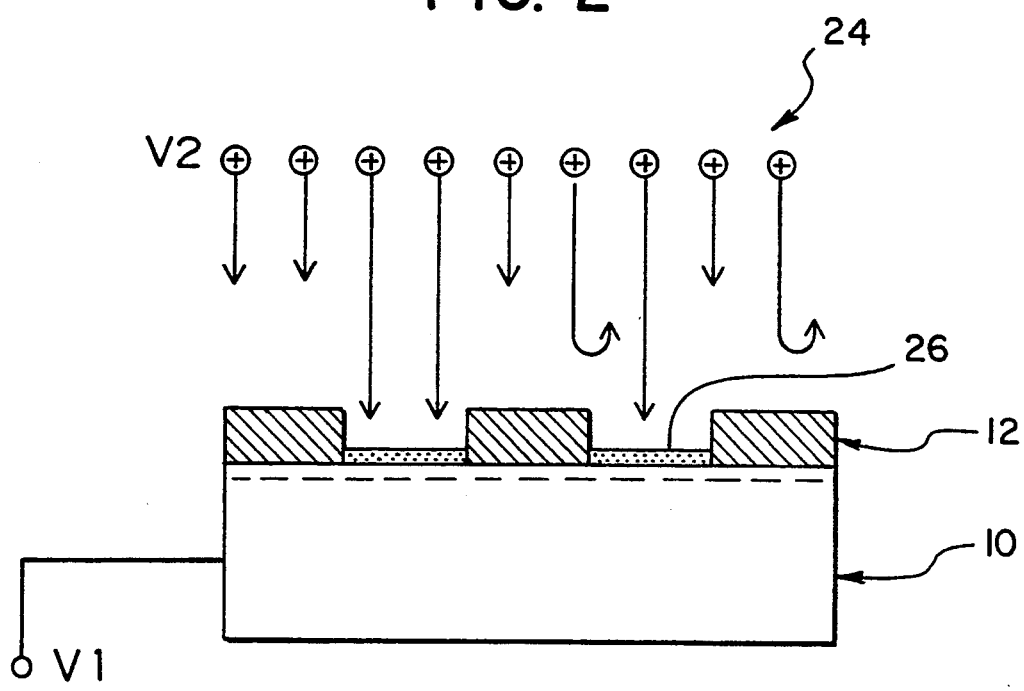
FIG. 2 is a schematic, vertical sectional view showing ion beam deposition of material on the patterned substrate according to a preferred embodiment of the present invention.

A passive selective area deposition is illustrated in FIG. 2. In order to selectively deposit material on the exposed upper surface of the Si substrate 10, the deposition material is delivered in ionized form. This enables electric fields in the vicinity of the substrate surface to be used to control the deposited pattern. Parallel beams of ions 24, incident perpendicular to the exposed surfaces, may be from the deceleration region of a low energy ion beam deposition system, such as the one described in the Yamada et al. article mentioned above. The ions are from a mass-analyzed beam at an energy of 35 keV, but a source of thermal or super thermal mass-analyzed or non-mass-analyzed ions could also be employed. Virtually any source of ions can be used. The surface of the substrate 10 must be patterned prior to deposition in order to produce the near-surface electric fields, however. Patterning can be accomplished, when manufacturing semiconductor devices, by using standard lithography techniques.

In FIG. 2, the pattern is composed of conductive regions, which will be covered in the deposition process, and insulating regions. A bias voltage V1 is applied to the substrate 10 to give the substrate 10 a potential that is less than the energy of the ion beam. Thus, the ions will reach the surface of the substrate 10 exposed at the bottom of the troughs 14 and 16, and a thin film 26 is formed. The insulating region charges up in the initial stages of deposition and thus retards the formation of films in these regions. The incident ions 24 are decelerated from a voltage V2 which, for example, could be 35 keV. Initially, there is no repulsion on the insulator 12, so that a thin layer begins to deposit during which time a repulsive potential develops on the insulator due to the charges on the ions and the insulating properties of the layer 12. This self-charging limits further deposition, meaning that the thickness of the layer is self-limited. Alternatively, an initial dose of inert ions could be used to "precharge" the insulating areas, thereby eliminating all deposition on these regions.

Figure 3:
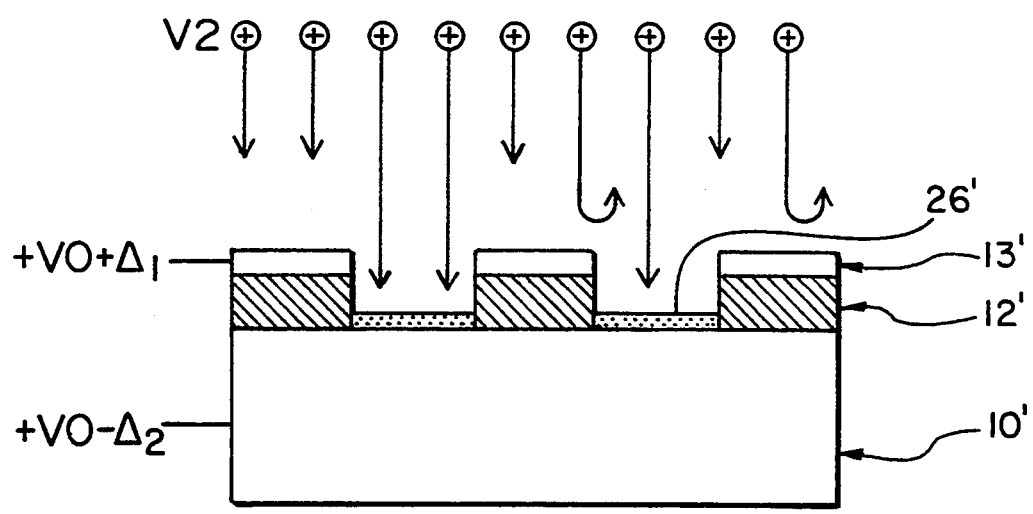
FIG. 3 is a schematic, vertical sectional view showing ion beam deposition of material on the patterned substrate according to another preferred embodiment of the present invention.

FIG. 3 illustrates an example of active selective area deposition according to the present invention. In FIG. 3, the same, but primed, reference numerals are used to identify structure found in FIG. 2. In this case, however, a conducting metallic surface layer 13 is formed on the insulating layer 12' to define a bilayer structure on the substrate 10'. The pattern must be etched through both the upper conducting layer 13 and the insulating layer 12'. The upper conducting layer 13 is given an electrical potential indicated as $+V0+\Delta 1$, where V0 is the initial potential used to accelerate the ions. A repulsive potential, slightly smaller than the potential used to accelerate the ions, is applied to the substrate 10' as indicated as $+V0-\Delta 2$. The conducting layer 13 is held at an even higher repulsive potential so that the ions do not reach this surface. As a result, selective area deposition occurs to form a layer 26'. For a thermal plasma-type source, an attractive potential would be applied to the substrate 10', while the conducting layer 13 would be held at a repulsive potential. In any event, the present invention applies to ions of any energy from virtually any source. The material approaching the sample must be in ionized form so that it can be controlled by the local electric fields. Single atoms, molecules, or clusters of atoms can be used as long as they are ionized.

The substrate potential can be either attractive or repulsive depending on the energy of the incident ions. For either positive or negative high energy ions, the substrate potential will be repulsive. In other words, a charge of the same sign as the ions, but at a potential somewhat lower than the kinetic energy the ions initially have. This difference in energy is the energy with which the ions strike the surface of the growing film. The energy can be adjusted to improve the adhesion, density, epitaxy, etc. of the film.

The present invention also encompasses cases in which the ions, either positive or negative, are initially at low energies (thermal, for instance). In this case, the potential on the substrate 10' would be attractive (the opposite sign from the ions), while the conducting layer 13 would be slightly repulsive in order to prevent deposition. It should be noted that in this case the energy of the arriving ions can also be tailored to maximize the characteristics of the deposited layer 26'. However, the use of a high energy mass-analyzed beam has advantages in terms of the purity of the deposition since only a single isotope of a single element can pass through the analyzing fields.

The magnitudes of the bias voltages are dependent upon both the size of the surface features and the strength of the electric field above the surface. These biases will cause the approaching ions to be drawn into the surface and deposited on the exposed substrate 10' while simultaneously being repelled away from the regions covered by the conductive film 13.

Over a very broad range, this selective deposition technique can be applied independently of the size of the patterns. With appropriate choice of bias voltages, the present techniques will work equally well for submicron to macroscopic size features.

In an example of typical dimensions, the metallic surface layer 13 of FIG. 3 is 0.1 micron, and the $SiO_2$ insulating layer 12' is 0.5 micron.

As mentioned, other sources of ionized particles could be used, and thus, the present invention encompasses the use of all types of ionized incident particles, including ionized atoms, molecules, clusters of atoms, and larger fragments of material. In any event, the deposited particles must be ionized.

Also, the present invention is not limited to the layered structures illustrated herein. For example, multiple stacked conducting overlayers could be used that would be maintained at different potentials and would permit greater control of pattern generation by focusing the incident ions, particularly into high aspect ratio (depth to width) features.

The present invention is particularly suitable for processing integrated circuits, especially in metallization and in the selective filling of etched surface features. Moreover, the invention is applicable in any field requiring selective area deposition of thin films, particularly over complex patterns.

While advantageous embodiments have been chosen to illustrate the invention, it will be understood by those skilled in the art that various changes and modifications can be made therein without departing from the scope of the invention as defined in the appended claims.

What is claimed is:

1. A method of selective area deposition of a thin film of an ionized material from an ion source having an original electrical potential on an electrically biased substrate having an insulating pattern formed thereon and a conducting layer formed on the insulating pattern, a portion of the substrate being exposed between adjacent portions of the insulating pattern, the method including the steps of:

applying a first electrical potential to the substrate, said first electrical potential being sufficiently distinct from the original electrical potential of the ionized material to attract ionized material onto the exposed portion of the substrate;

applying a second electrical potential to the conducting layer, the second electrical potential being similar to the original electrical potential to cause repulsion of the ionized material from the conducting layer and distinct from the first electrical potential to permit attraction of the ionized material to the exposed substrate; and irradiating the patterned substrate with the ionized material from the ion source having the original electrical potential which avoids implantation of the ionized material into the exposed portion of the substrate.

2. A method according to claim 1, wherein the conducting layer and the ionized material have a positive electrical charge imparted by the second and original electrical potentials, respectively, and the substrate has a negative electrical charge imparted by the first electrical potential.

3. A method according to claim 1, wherein the ion source has an energy of about 35 keV.

4. A method according to claim 1, wherein the substrate is Si and the pattern is defined by forming a $SiO_2$ layer on the Si substrate, the $SiO_2$ layer having troughs which expose an upper surface of the Si substrate.

* * * * *